United States Patent
Seo et al.

(10) Patent No.: US 8,389,983 B2
(45) Date of Patent: Mar. 5, 2013

(54) ORGANIC LIGHT EMITTING APPARATUS AND METHOD OF MANUFACTURING ORGANIC LIGHT EMITTING APPARATUS

(75) Inventors: Sang-Joon Seo, Yongin (KR); Kie-Hyun Nam, Yongin (KR); Sung-Guk An, Yongin (KR); Jung-Woo Moon, Yongin (KR); Hyun-Woo Koo, Yongin (KR); Jin-O Lim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 12/890,104

(22) Filed: Sep. 24, 2010

(65) Prior Publication Data

US 2011/0140164 A1 Jun. 16, 2011

(30) Foreign Application Priority Data

Dec. 14, 2009 (KR) .............................. 2009-0123989

(51) Int. Cl.
*H01L 51/50* (2006.01)
*H01L 33/52* (2010.01)

(52) U.S. Cl. .................. 257/40; 257/100; 257/E33.059; 438/26; 438/99

(58) Field of Classification Search .................. 257/40, 257/79, 100, E33.001, E33.059, E33.061; 438/22, 26, 99
See application file for complete search history.

(56) References Cited

U.S. PATENT DOCUMENTS

| | | |
|---|---|---|
| 2001/0005528 A1 | 6/2001 | Lee et al. |
| 2001/0015620 A1* | 8/2001 | Affinito ........................ 313/512 |
| 2003/0057422 A1 | 3/2003 | Yamazaki et al. |
| 2003/0184219 A1 | 10/2003 | Duggal et al. |
| 2004/0247949 A1* | 12/2004 | Akedo et al. ................... 428/704 |
| 2005/0048224 A1 | 3/2005 | Araya et al. |
| 2005/0116637 A1 | 6/2005 | Yoshizawa |
| 2005/0127371 A1* | 6/2005 | Yamazaki et al. ............... 257/72 |
| 2007/0264428 A1 | 11/2007 | Irikura |
| 2007/0273280 A1* | 11/2007 | Kim et al. ....................... 313/509 |
| 2008/0018230 A1 | 1/2008 | Yamada et al. |
| 2008/0305360 A1 | 12/2008 | Han et al. |

FOREIGN PATENT DOCUMENTS

| | | |
|---|---|---|
| JP | 05-164929 | 6/1993 |
| JP | 06-243966 | 9/1994 |
| JP | 11199864 | 7/1999 |
| JP | 2000-87224 A | 3/2000 |
| JP | 2002117973 | 4/2002 |

(Continued)

OTHER PUBLICATIONS

Japanese Office action issued by JPO on Feb. 7, 2012, corresponding to JP 2010-264139 and Request for Entry attached herewith.
Korean Office Action issued by KIPO, dated Mar. 31, 2011, corresponding to Korean Patent Application No. 10-2009-0123989, together with Request for Entry.
Korean Registration Determination Certificate issued by KIPO on Nov. 29, 2011, corresponding to KR 10-2009-0123989 and Request for Entry attached herewith.

(Continued)

*Primary Examiner* — Jarrett Stark
*Assistant Examiner* — Michele Fan
(74) *Attorney, Agent, or Firm* — Robert E. Bushnell, Esq.

(57) ABSTRACT

An organic light emitting apparatus and a method of manufacturing the organic light emitting apparatus. According to the organic light emitting apparatus and the method of manufacturing the organic light emitting apparatus, the characteristics of a barrier layer are maintained and a stress of a substrate is reduced, even at a high temperature, thereby increasing the manufacturing stability of the organic light emitting apparatus.

20 Claims, 6 Drawing Sheets

FOREIGN PATENT DOCUMENTS

| | | | | |
|---|---|---|---|---|
| JP | 2002117973 | A | * | 4/2002 |
| JP | 2003-86356 | A | | 3/2003 |
| JP | 2003-092188 | A | | 3/2003 |
| JP | 2003-109748 | A | | 4/2003 |
| JP | 2003109748 | A | * | 4/2003 |
| JP | 2004-87253 | A | | 3/2004 |
| JP | 200577430 | | | 3/2005 |
| JP | 2005-123012 | A | | 5/2005 |
| JP | 2005-522016 | A | | 7/2005 |
| JP | 2005-319678 | A | | 11/2005 |
| JP | 2006-278021 | A | | 10/2006 |
| JP | 2006278021 | A | * | 10/2006 |
| JP | 2008311076 | | | 12/2008 |
| JP | 2009-199777 | A | | 9/2009 |
| KR | 10-0813853 | B1 | | 3/2008 |
| KR | 10-2008-0093584 | A | | 10/2008 |
| KR | 1020080107220 | | | 12/2008 |

OTHER PUBLICATIONS

Japanese Office Action issued on Jun. 12, 2012 by JPO in connection with Japanese Patent Application Serial No. 2010-264139, which also claims Korean Patent Application Serial No. 10-2009-0123989 as its priority document and Request for Entry of the Accompanying Office Action attached herewith.

Japanese Office Action issued by JPO on Nov. 6, 2012 in connection with Japanese Patent Application No. 2010-264139, which also claims Korean Patent Application No. 2009-0123989 as its priority document and Request for Entry of the Accompanying Office Action attached herewith.

* cited by examiner

US 8,389,983 B2

ORGANIC LIGHT EMITTING APPARATUS AND METHOD OF MANUFACTURING ORGANIC LIGHT EMITTING APPARATUS

CLAIM OF PRIORITY

This application makes reference to, incorporates the same herein, and claims all benefits accruing under 35 U.S.C. §119 from an application earlier filed in the Korean Intellectual Property Office on 14 Dec. 2009 and there duly assigned Serial No. 10-2009-0123989.

BACKGROUND OF THE INVENTION

1. Field of the Invention

The present invention relates to an organic light emitting apparatus in which the characteristics of a barrier layer are maintained and a stress of a substrate is reduced, even at a high temperature, thereby increasing the manufacturing stability of the organic light emitting apparatus, and a method of manufacturing the organic light emitting apparatus.

2. Description of the Related Art

A substrate for a flexible display device must be made out of very flexible materials. Research has been mainly conducted on use of polycarbonate, polyimide, and poly(arylene ether sulfone) as a material for forming a plastic substrate.

SUMMARY OF THE INVENTION

The present invention provides an organic light emitting apparatus in which the characteristics of a barrier layer are maintained and a stress of a substrate is reduced during the manufacture of a thin film transistor (TFT), even at a high temperature, thereby increasing the manufacturing stability of organic light emitting apparatus, and a method of manufacturing the organic light emitting apparatus.

According to an aspect of the present invention, there is provided an organic light emitting apparatus that includes a substrate, a barrier layer arranged on the substrate, an organic light emitting device comprising a first electrode, an organic light emitting layer, and a second electrode that are sequentially arranged on the barrier layer and an encapsulation layer covering the organic light emitting device, wherein at least one of the barrier layer and the encapsulation layer is a composite layer arrangement comprising a first inorganic layer, a first organic layer, and a second inorganic layer that are sequentially stacked, and wherein the first organic layer is a polyimide layer produced by a process that includes depositing a monomer via a technique selected from a group consisting of a thermal evaporation technique, a plasma enhanced chemical vapor deposition (PECVD) technique and an atomic layer deposition (ALD) technique; and then heating the monomer.

The monomer for forming the polyimide layer may include at least one acid component selected from a group consisting of perylenetetracarboxylic dianhydride (PTCDA), biphenyltetracarboxylic dianhydride (BPDA) and pyromellitic dianhydride (PMDA) and at least one amine component selected from the group consisting of diaminododecane (DADD), oxydianiline (ODA) and phenylene diamine (PDA). The first inorganic layer and the second inorganic layer each independently includes at least one material selected from a group consisting of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride (SiON), and aluminum. The organic light emitting apparatus may further include at least one stack layer arrangement comprised of a second organic layer and a third inorganic layer, wherein the at least one stack layer arrangement is arranged on the second inorganic layer. The composite layer arrangement can include alumina, polyimide, and, alumina that are sequentially arranged. A thickness of the composite layer arrangement can be in the range of about 10 nm to about 10 μm, A thickness of the first organic layer can be in the range of about 1 nm to about 1 μm. A thickness of the first organic layer can be in the range of about 300 to about 500 nm.

According to another aspect of the present invention, there is provided a method of manufacturing an organic light emitting apparatus, including preparing a substrate, forming a barrier layer on the substrate, forming an organic light emitting device comprising a first electrode, an organic light emitting layer, and a second electrode that are sequentially arranged on the barrier layer and forming an encapsulation layer on the organic light emitting device to cover the organic light emitting device, wherein the forming of the barrier layer includes forming a first inorganic layer, forming a first organic layer comprising polyimide by depositing a monomer on the first inorganic layer via a technique selected from a group consisting of a thermal evaporation technique, a plasma enhanced chemical vapor deposition (PECVD) technique and an atomic layer deposition (ALD) technique and then heating the monomer and forming a second inorganic layer on the first organic layer.

The monomer for forming polyimide includes at least one acid component selected from a group consisting of perylenetetracarboxylic dianhydride (PTCDA), biphenyltetracaiboxylic dianhydride (BPDA) and pyromellitic dianhydride (PMDA) and at least one amine component selected from a group consisting of diaminododecane (DADD), oxydianiline (ODA) and phenylene diamine (PDA). The heating of the monomer includes heating the monomer to a temperature of about 85 to abort 350° C. The heating of the monomer includes heating the monomer to a temperature of about 85 to about 125° C. A thickness of the first organic layer can be in the range of about 1 nm to about 1 μm. A thickness of the first organic layer can be in the range of about 300 to about 500 nm. An entire thickness of the first inorganic layer, the first organic layer and the second inorganic layer can be in the range of about 10 nm to about 10 μm.

The method can further include forming a second organic layer comprising polyimide by depositing a monomer on the second inorganic layer via a technique selected from a group consisting of a thermal evaporation technique, a PECVD technique or an ALD technique and then heating the monomer and forming a third inorganic layer on the second organic layer. The forming of the encapsulation layer can include forming a first inorganic layer, forming a first organic layer comprising polyimide by depositing a monomer on the first inorganic layer via a technique selected from a group consisting of a thermal evaporation technique, a PECVD technique and an ALD technique and then heating the monomer and forming a second inorganic layer on the first organic layer.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

A substrate for a flexible display device must be made out of very flexible materials. Research has been mainly conducted on use of polycarbonate, polyimide, and poly(arylene ether sulfone) as a material for forming a plastic substrate.

Since an organic light emitting diode (OLED) display includes an organic material, when the OLED display is exposed to oxygen or moisture, the lifetime thereof may be remarkably reduced. Consequently, it is also desirable to have a substrate that does not allow moisture or oxygen to reach the organic material from the outside.

A water vapor transmission rate (WVTR) of a general plastic substrate is about 10 to about 1,000 g/m$^2$/day. Thus, due to the high transmission characteristics of the plastic substrate, a transmission rate equal to or less than $1\times10^{-6}$/m$^2$/day is required for a long lifetime of an OLED display. Thus, a barrier layer is generally formed on the plastic substrate to reduce the rate that water is transmitted to the organic layer.

In order to manufacture a flexible display, a polymer solution is coated on a glass substrate to form a polymer layer, a barrier layer is formed on the polymer layer, and then a thin film transistor (TFT) device and parts constituting the flexible display are formed on the barrier layer. Since a TFT manufacturing process is performed at a relatively high temperature, it is difficult to align the barrier layer formed by alternately forming an organic layer and an inorganic layer due to a difference between the coefficients of thermal expansion (CTE) thereof when the TFT is manufactured. Thus, when a stack structure is formed by alternately forming an organic layer and an inorganic layer, internal stress needs to be reduced, and devices need to be stably manufactured by using a polymer material with a CTE that is nearly unaffected by a temperature change.

Figure 1:
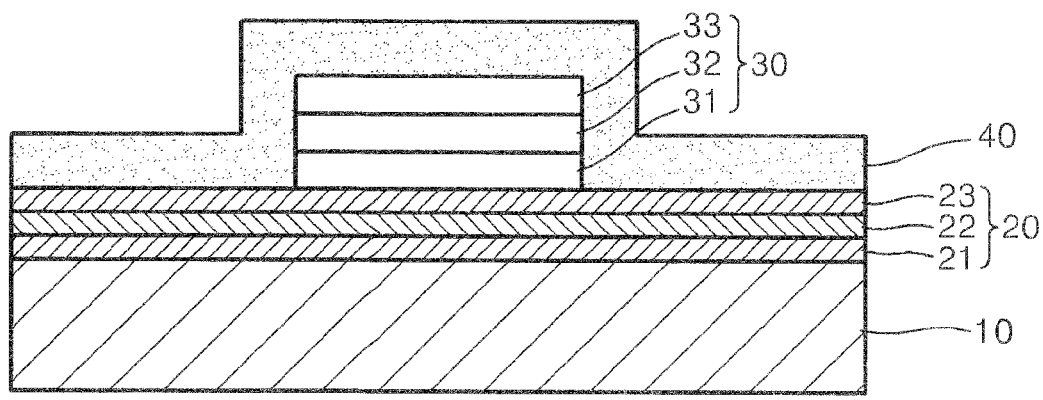
FIG. 1 is a cross-sectional view of an organic light emitting apparatus according to an embodiment of the present invention.

Turning now to FIG. 1, FIG. 1 is a cross-sectional view of an organic light emitting apparatus according to an embodiment of the present invention. Referring to FIG. 1, the organic light emitting apparatus includes a substrate 10, a barrier layer 20 formed on the substrate 10, an organic light emitting device 30 including a first electrode 31, an organic light emitting layer 32 and a second electrode 33 that are sequentially formed on the barrier layer 20, and an encapsulation layer 40 covering the organic light emitting device 30. The barrier layer 20 is a composite layer including a first inorganic layer 21, a first organic layer 22, and a second inorganic layer 23 that are formed sequentially.

The substrate 10 may be a flexible substrate that has a smaller specific gravity than a conventional glass substrate, is not likely crack, and has a curved shape. For example, the substrate 10 may be a plastic substrate.

The barrier layer 20 is formed on the substrate 10, and prevents impurity ions from the substrate and external moisture and air from penetrating into the organic light emitting apparatus. The barrier layer 20 includes an organic/inorganic composite barrier layer including a stack structure of the first inorganic layer 21, the first organic layer 22, and the second inorganic layer 23.

Figure 2:
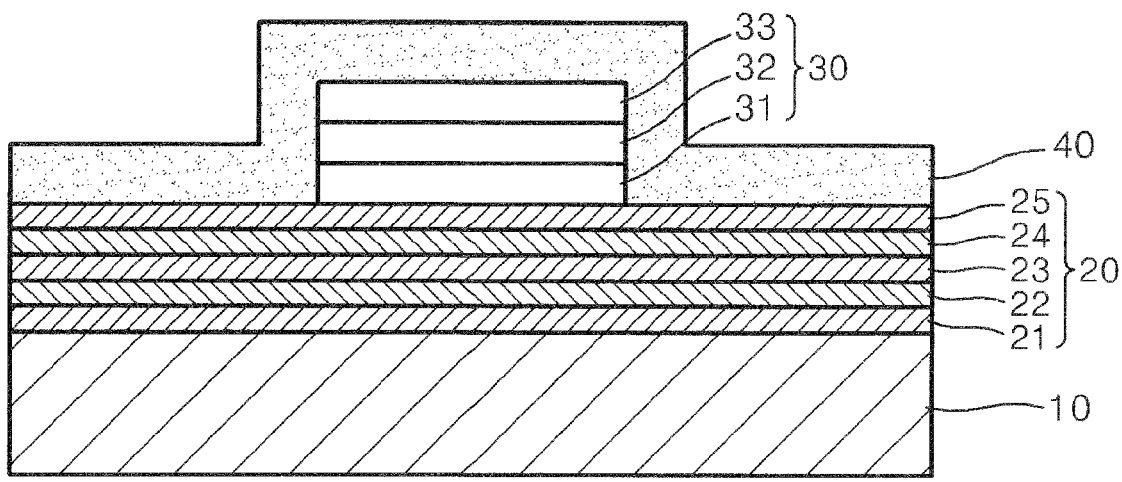
FIG. 2 is a cross-sectional view of an organic light emitting apparatus according to another embodiment of the present invention.

According to an embodiment of the present invention, a second organic layer 24 and a third inorganic layer 25 may be stacked on the second inorganic layer 23 that is the uppermost layer of the barrier layer 20, as shown in FIG. 2. In addition, a stack structure of the second organic layer 24 and the third inorganic layer 25 may be stacked two or more times on top of second inorganic layer 23 to form the barrier layer 20.

Thin film materials used for forming the first inorganic layer 21 and the second inorganic layer 23 and techniques of stacking the first inorganic layer 21 and the second inorganic layer 23 are not particularly limited as long as the materials and the techniques are well known in the art to which the present invention pertains.

Examples of the thin film materials used for forming the first inorganic layer 21 and the second inorganic layer 23 may include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride (SiON), and aluminum. Examples of the technique of stacking the first inorganic layer 21 and the second inorganic layer 23 may include a vacuum film-forming technique such as a sputtering technique, a chemical vapor deposition (CVD) technique, an electron-beam (e-beam) technique, a heat deposition technique, and a thermal ion beam assisted deposition (IBAD) technique. The CVD technique may include an induced coupled plasma-chemical vapor deposition (CP-CVD) technique, a capacitively coupled plasma-chemical vapor deposition (CCP-CVD) technique, and a Surface Wave Plasma-chemical vapor deposition (SWP-CVD) technique.

The first organic layer 22 of the barrier layer 20 may be disposed between the first inorganic layer 21 and the second inorganic layer 23. Conventionally, organic layers used in a barrier layer are mainly made out of an acryl-based material or a polyimide-based material. The acryl-based material is capable of being deposited at a low temperature, but a device made out of the acryl-based material may deteriorate due to a difference between the coefficients of thermal expansion (CTE) of the acryl-based material and the underlying substrate in a subsequent high-temperature process. The polyimide-based material may resolve the stress issue that occurs in a high-temperature process since the polyimide-based material has the same CTE as glass used in a substrate. However, the polyimide-based material may be deposited using a wet process, and consequently it is difficult to adjust the thickness of the deposition layer made out of the polyimide-based material due to the characteristics of the wet process. In addition, it is difficult to obtain mass-production since the wet process is complicated.

In the organic light-emitting apparatus according to the present embodiment, a monomer having at least one acid component and at least one amine component are co-deposited using a dry process such as a thermal evaporation technique, a plasma enhanced chemical vapor deposition (PECVD) technique, or an atomic layer deposition (ALD) technique, and then the monomer is heated to form the first organic layer 22. Thus, after an inorganic layer is formed, consecutive processes may be performed in a chamber so that the thickness of a deposition layer may be easily adjusted, unlike in a wet process. In addition, in the case of the dry process, an amount of moisture generated when polyimide is formed is small. The dry process is suitable to mass-production. In addition, the first organic layer 22 may compensate for a defective layer and may function as a smoothing layer due to high step coverage thereof.

According to the present embodiment, the monomer used to form the polyimide first organic layer 22 may include at least one acid component selected from the group consisting of perylenetetracarboxylic dianhydride (PTCDA), biphenyltetracarboxylic dianhydride (BPDA) and pyromellitic dianhydride (PMDA), and at least one amine component selected from the group consisting of diaminododecane (DADD), oxydianiline (ODA) and phenylene diamine (PDA), but the present invention is in no way so limited. That is, the first organic layer 22 may be made out of any monomer for forming a polyimide-based resin that is well known in the art to which the present invention pertains.

The acid component and the amine component are co-deposited using a dry process such as a thermal evaporation technique, a PECVD technique or an ALD technique, and then the resultant is heated to polymerize the deposited material to produce a polyimide-based resin.

The thickness of the first organic layer 22 may be in the range of about 1 nm to about 1 μm, and more particularly, about 300 to about 500 nm. If the thickness of the first organic layer 22 is outside this range, and the first organic layer 22 is too thick, and it takes too much time to prepare the polyimide. In addition, if the first organic layer 22 is too thin, particles of the second inorganic layer 23 formed on the first organic layer 22 may not be covered.

The thickness of the barrier layer 20 may be in the range of about 10 nm to about 10 μm. In this range, the performance of the barrier layer 20 may be optimized.

The organic light emitting device 30 is disposed on the barrier layer 20. The organic light emitting device 30 may include the first electrode 31, the organic light emitting layer 32, and the second electrode 33. The first electrode 31 may be formed on the barrier layer 20 by using a vacuum deposition technique or a sputtering technique, and may be a cathode or an anode. The first electrode 31 may be a transparent electrode, a semi-transparent electrode or a reflective electrode, and may be made out of indium tin oxide (ITO), indium zinc oxide (IZO), a tin dioxide ($SnO_2$), zinc oxide (ZnO), aluminum (Al), silver (Ag), magnesium (Mg), or the like, but is not limited thereto. In addition, the first electrode 31 may include a two or more layered-structure made out of two or more different materials, and may be embodied in any of various ways.

The organic light emitting layer 32 is disposed on the first electrode 31. The organic light emitting layer 32 may include a light emitting material that is well known in the art to which the present invention pertains. Examples of such light emitting material may include a well-known host such as Tris(8-hydroxyquinolinato)aluminium ($Alq_3$), 4,4'-N,N'-dicarbazole-biphenyl (CBP), poly(n-vinylcarbazole) (PVK) and distyrylarylene (DSA), and a well-known dopant such as platinum(II) octaethylporphyrin (PtOEP), Ir(piq)$_3$, Btp$_2$Ir(acac), 4-(dicyanomethylene)-2-t-butyl-6-(1,1,7,7-tetramethyljulolidyl-9-enyl)-4Hpyra (DCJTB) (so far, red dopants), Ir(ppy)$_3$ (where "ppy" denotes phenylpyridine), Ir(ppy)$_2$ (acac), Ir(mpyp)$_3$ (so far, green dopants), F$_2$Irpic, (F$_2$ppy)$_2$Ir (tmd), Ir(dfppz)$_3$, and ter-fluorene (so far, blue dopants), but are not limited thereto.

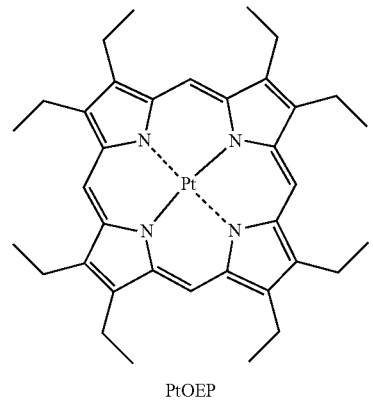

PtOEP

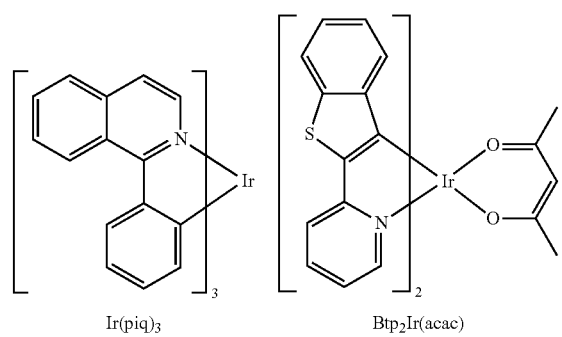

Ir(piq)$_3$  Btp$_2$Ir(acac)

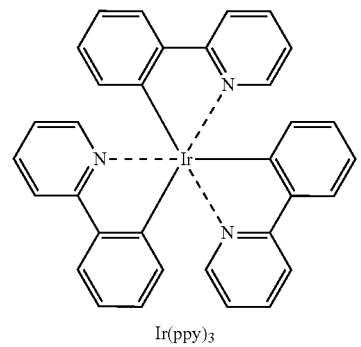

Ir(ppy)$_3$

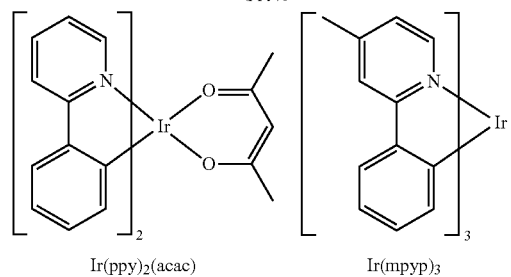

Ir(ppy)$_2$(acac)  Ir(mpyp)$_3$

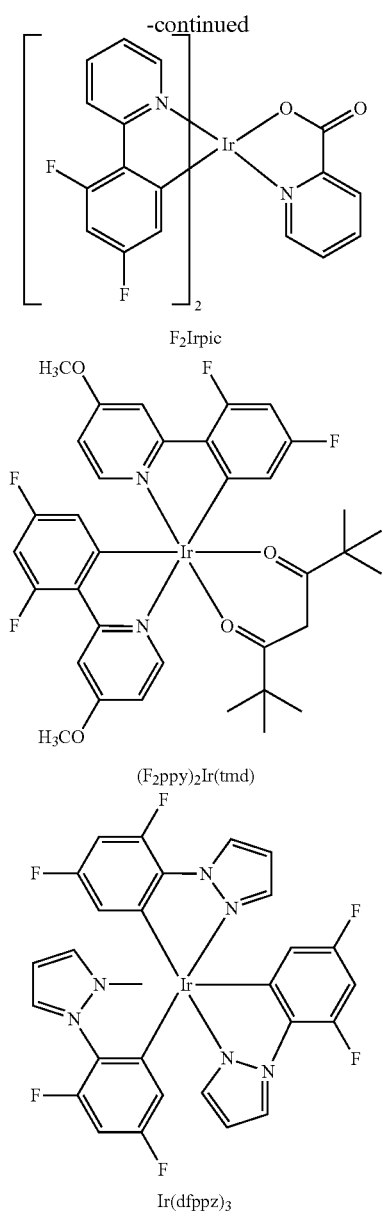

the electron injection layer may be made out of a well known material, and produced by a well-known technique.

Examples of materials used for forming the hole injection layer may include a phthalocyanine compound such as copperphthalocyanine, 4,4',4"-tris(3-methylphenylphenylamino) triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline)/poly(4-styrenesulfonate (PANI/PSS), but are not limited thereto.

Examples of materials used for forming the hole transport layer, include but are not limited to carbazole derivatives such as N-phenylcarbazol or polyvinylcarbazol, and amine derivatives having an aromatic condensed ring, such as NPB, N,N'-bis (3-methylphenyl)- N,N'-diphenyl-[1,1-biphenyl]-4,4'-diamine (TPD), or N,N'-di(naphthalene-1-yl) -N,N'-diphenyl benzidine (α-NPD). Examples of materials used for forming the hole blocking layer may include oxadiazole derivatives, triazole derivatives, or phenathroline derivatives.

Examples of materials used for the electron transport layer may include, but are not limited to, quinoline derivatives, such as tris(8-quinolinolate)aluminum ($Alq_3$) or 3-(4-biphenylyl)-4-phenyl-5-(4-tert-butyphenyl)-1,2,4-triazole (TAZ). Examples of materials used for forming the electron injection layer may include, but are not limited to LiF, NaCl, CsF, $Li_2O$ or BaO.

Although not illustrated in detail, a protective layer may be disposed on the organic light emitting device 30. The protective layer may be made out of an organic or inorganic material that may prevent the second electrode 33 of the organic light emitting device 30 from being oxidized by moisture and oxygen. In addition, the protective layer may include an organic/inorganic composite layer, and may be embodied in any of various ways.

The encapsulation layer 40 is disposed on the organic light emitting device 30 to cover the organic light emitting device 30 in order to prevent external oxygen and moisture from penetrating into the organic light emitting device 30. A material and a forming technique of the encapsulation layer 40 are not particularly limited as long as the material and the forming technique are well known in the art to which the present invention pertains.

Figure 3:
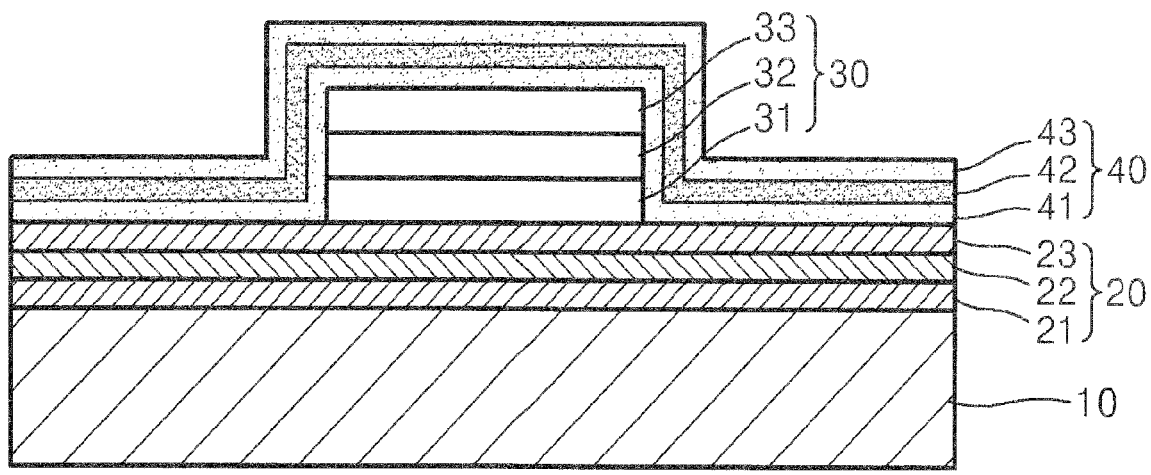
FIG. 3 is a cross-sectional view of an organic light emitting apparatus according to another embodiment of the present invention.

As shown in FIG. 3, the encapsulation layer 40 may be a composite layer including a first inorganic layer 41, a first organic layer 42 and a second inorganic layer 43 that are sequentially stacked, like the barrier layer 20. In addition, at least one stack structure of a second organic layer and a third inorganic layer may be stacked on the second inorganic layer 43 that is the uppermost layer of the encapsulation layer 40 to form the encapsulation layer 40.

The encapsulation layer 40 may be made out of the same inorganic and organic materials as the barrier layer 20. The organic/inorganic composite layer constituting the barrier layer 20 has excellent barrier characteristics for preventing penetration of oxygen and moisture, and thus may also be used in the encapsulation layer 40.

Although not illustrated, according to another embodiment, a barrier layer may be made out of a well-known material, and only an encapsulation layer may be a composite layer made by sequentially stacking an inorganic material, an organic material and an inorganic material.

Next, a method of manufacturing an organic light emitting apparatus will be described. According to an embodiment of the present invention, a method of manufacturing an organic light emitting apparatus may include preparing a substrate;

The second electrode 33 may be formed on the organic light emitting layer 32 by using a vacuum deposition technique or a sputtering technique, and may be a cathode or an anode. The second electrode 33 may be made out of a metal, an alloy, an electrically conductive compound, or mixtures thereof, all of which have a low work function. Examples of such materials may include lithium (Li), magnesium (Mg), aluminum (Al), aluminum-lithium (Al—Li), calcium (Ca), magnesium-indium (Mg—In), and magnesium-silver (Mg—Ag). In addition, the second electrode 33 may include a two or more layered-structure made out of two or more different materials, and may be embodied in any of various ways.

Although not illustrated in FIG. 1, the organic light emitting apparatus according to the present embodiment may further include between the first electrode 31 and the second electrode 33 at least one layer selected from the group consisting of a hole injection layer, a hole transport layer, a hole blocking layer, an electron transport layer, and an electron injection layer. The hole injection layer, the hole transport layer, the hole blocking layer, the electron transport layer and forming a barrier layer on the substrate; forming an organic light emitting device including a first electrode, an organic light emitting layer and a second electrode sequentially on the barrier layer; and forming an encapsulation layer on the organic light emitting device to cover the organic light emitting device, wherein the forming of the barrier layer may include forming a first inorganic layer; depositing a monomer for forming polyimide on the first inorganic layer by using a thermal evaporation technique, a PECVD technique or an ALD technique, and then heating the monomer to form a first organic layer made out of polyimide; and forming a second inorganic layer on the first organic layer. According to an embodiment of the present invention, the barrier layer may be formed by sequentially forming a first inorganic layer, a first organic layer and a second inorganic layer on the substrate. Materials and a stacking method of the first inorganic layer and the second inorganic layer may not be particularly limited as long as the materials and the stacking method are well known in the art to which the present invention pertains.

In the forming of the first organic layer, a monomer for forming polyimide that includes at least one acid component and at least one amide component may be co-deposited using a dry process such as a thermal evaporation technique, a PECVD technique, or an ALD technique, and then may be heated to form the first organic layer made out of a polyimide-based resin.

When polyimide is formed using the dry process such as a thermal evaporation technique, or the like, it is possible to perform alternate deposition in-line after an organic layer is deposited, it is easy to adjust the thickness of an organic layer, and mass-production may be obtained since the dry process is simple compared to a wet process. Such a polyimide-based organic layer may compensate a defective layer and may function as a smoothing layer due to high step coverage thereof.

The monomer for forming polyimide used to form the first organic layer may include at least one acid component selected from PTCDA, BPDA and PMDA, and at least one amine component selected from DADD, ODA and PDA, but may not be limited thereto. That is, the first organic layer may be made out of any monomer for forming a polyimide-based resin that is well known to the art to which the present invention pertains.

The acid component and the amine component are co-deposited using a dry process such as a thermal evaporation technique, a PECVD technique or an ALD technique, and then the resultant is heated to polymerize a polyimide-based resin.

The heating of the deposited monomer to produce the polyimide organic layer occurs at a temperature of about 85 to about 350° C., and more particularly, about 85 to about 125° C. If such a heating temperature is within this range, it is easy to adjust the thickness of the first organic layer to be formed, and excellent surface characteristics may be obtained. The thickness of the first organic layer 22 may be in the range of 1 nm to 1 μm, and more particularly, about 300 to about 500 nm. After the first organic layer is formed, the second inorganic layer is formed on the first organic layer to manufacture the barrier layer having a stack structure of the first inorganic layer/the first organic layer/the second inorganic layer.

According to an embodiment of the present invention, a second organic layer and a third inorganic layer may be sequentially stacked on the second inorganic layer by using the same method as a stacking method of the second inorganic layer. In addition, at least one composite layer of the second organic layer and the third inorganic layer may be stacked to form a barrier layer.

After the barrier layer is formed, the organic light emitting device is formed on the barrier layer. The first electrode, the organic light emitting layer and the second electrode of the organic light emitting device may be formed using a well-known deposition technique, sputtering technique, or coating technique. In addition to the organic light emitting layer, at least one layer selected from the group consisting of a hole injection layer, a hole transport layer, an electron blocking layer, an electron transport layer and an electron injection layer may also be disposed between the first electrode and the second electrode.

After the organic light emitting device is formed on the barrier layer, the encapsulation layer is formed on the organic light emitting device so as to cover the organic light emitting device to complete manufacture the organic light emitting apparatus. According to an embodiment of the present invention, a method of forming the encapsulation layer may include forming a first inorganic layer; depositing a monomer for forming polyimide on the first inorganic layer by using a thermal evaporation technique, a PECVD technique or an ALD technique, and then heating the deposited monomer to form a first organic layer made out of polyimide; and forming a second inorganic layer on the first organic layer. Thus, the encapsulation layer may include a stack structure of the first inorganic layer/the first organic layer/the second inorganic layer.

According to an embodiment of the present invention, a stack layer of an organic layer/an inorganic layer may be further stacked on the uppermost inorganic layer two or more times to form an encapsulation layer. The first inorganic layer, the second inorganic layer, the second organic layer and the third inorganic layer may be formed using the above-described method.

Hereinafter, one or more embodiments of the present invention will be described in detail with reference to the following examples. However, these examples are not intended to limit the purpose and scope of the one or more embodiments of the present invention.

EXAMPLE

An $Al_2O_3$ layer having a thickness of 0.18 μm was stacked on a transparent plastic substrate by sputtering. PTCDA (perylenetetracarboxylic dianhydride) and DADD (diaminododecane) were co-deposited on the $Al_2O_3$ layer under conditions of about 365 to about 370° C. and a deposition rate of about 0.9 to about 1 Å/s (Angstroms per second), and conditions of about 44 to about 48° C. and a deposition rate of about 0.4 to about 0.5 Å/s (Angstroms per second), respectively, and then were heated for one hour at a temperature of 125° C. to form a polyimide layer having a thickness of 0.21 μm. An $Al_2O_3$ layer having a thickness of 0.18 μm was stacked on the polyimide layer by a sputtering technique to complete the barrier layer having a thickness of 0.57 μm.

Figure 4:
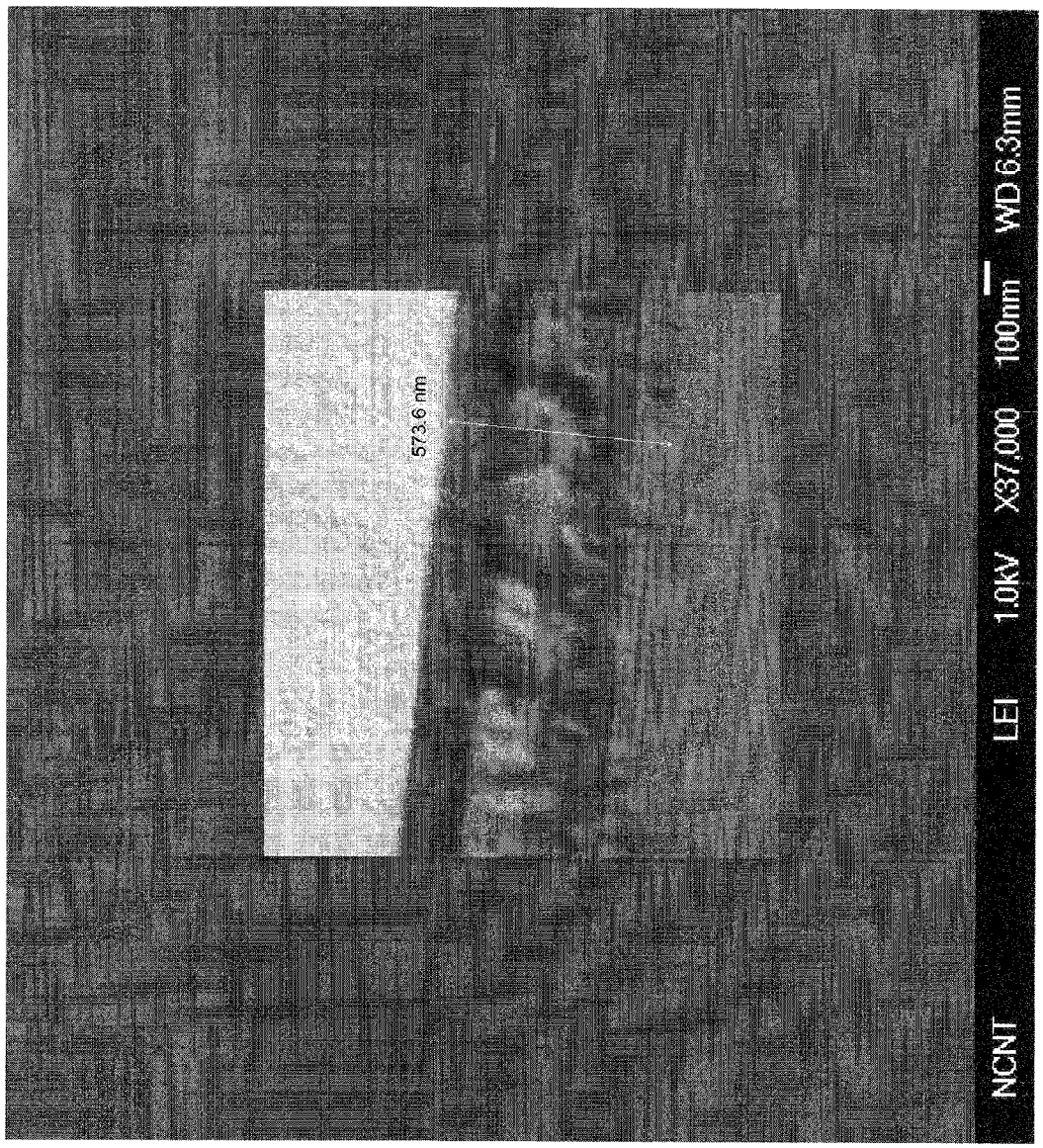
FIG. 4 is a field emission-scanning electron microscope (FE-SEM) image (35,000 times magnification) of a cross-section of a barrier layer of an organic light emitting apparatus according to an embodiment of the present invention.
Figure 5:
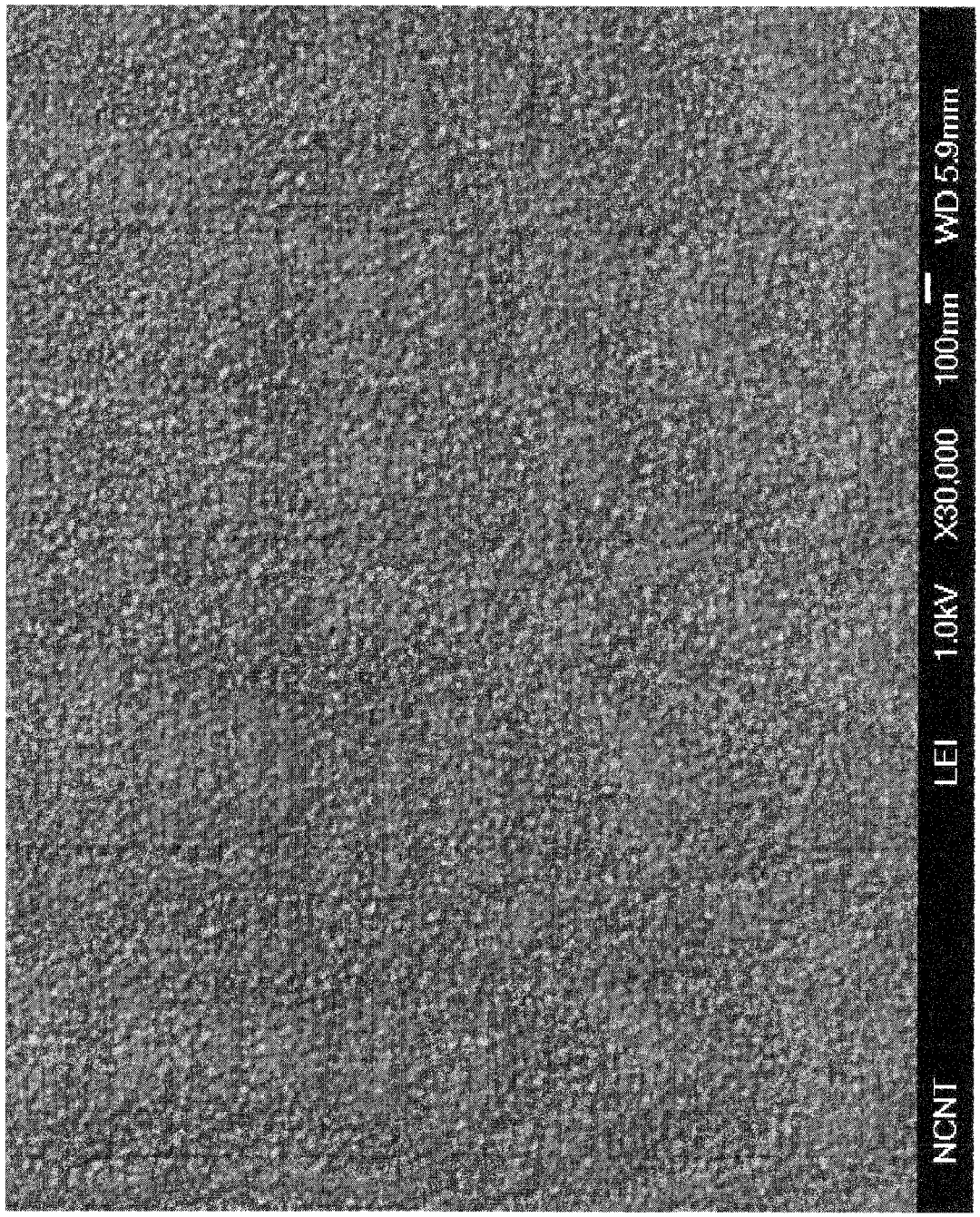
FIG. 5 is a FE-SEM image (30,000 times magnification) of a surface of a barrier layer of an organic light emitting apparatus according to an embodiment of the present invention.

Turning now to FIGS. 4 and 5, FIG. 4 is a field emission-scanning electron microscope (FE-SEM) image of a cross-section of the barrier layer and FIG. 5 is a FE-SEM image of a surface of the barrier layer. As shown in FIGS. 4 and 5, the barrier layer was formed to have a uniform thickness and a smooth surface. After an organic light emitting device was formed on the barrier layer, an $SiO_2$ encapsulation layer is deposited using an ion beam deposition technique to complete the manufacture of the organic light emitting apparatus.

Comparative Example

Figure 6:
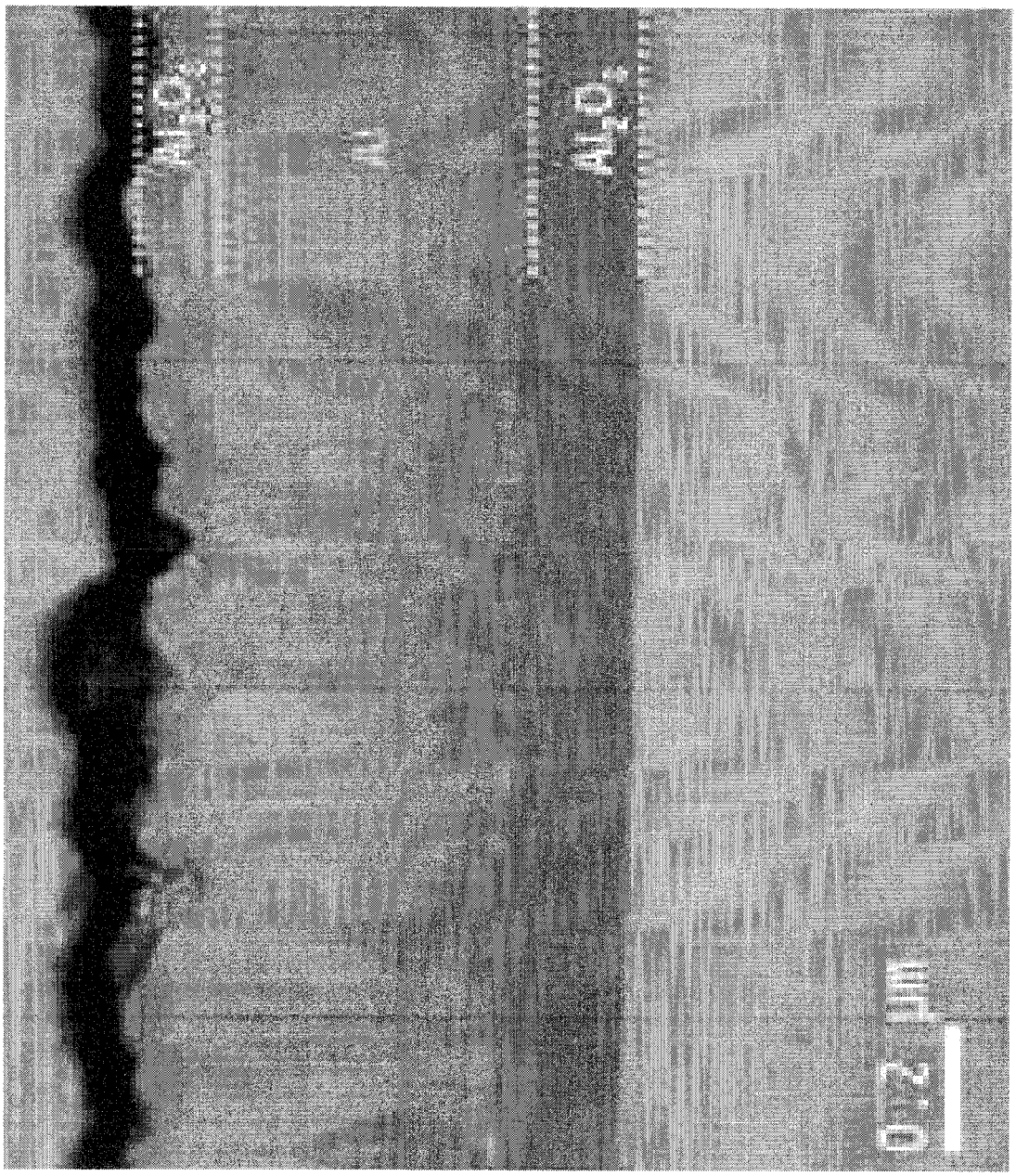
FIG. 6 is a FE-SEM image (35,000 times magnification) of a cross-section of a barrier layer of an organic light emitting apparatus manufactured in Comparative Example.
Figure 7:
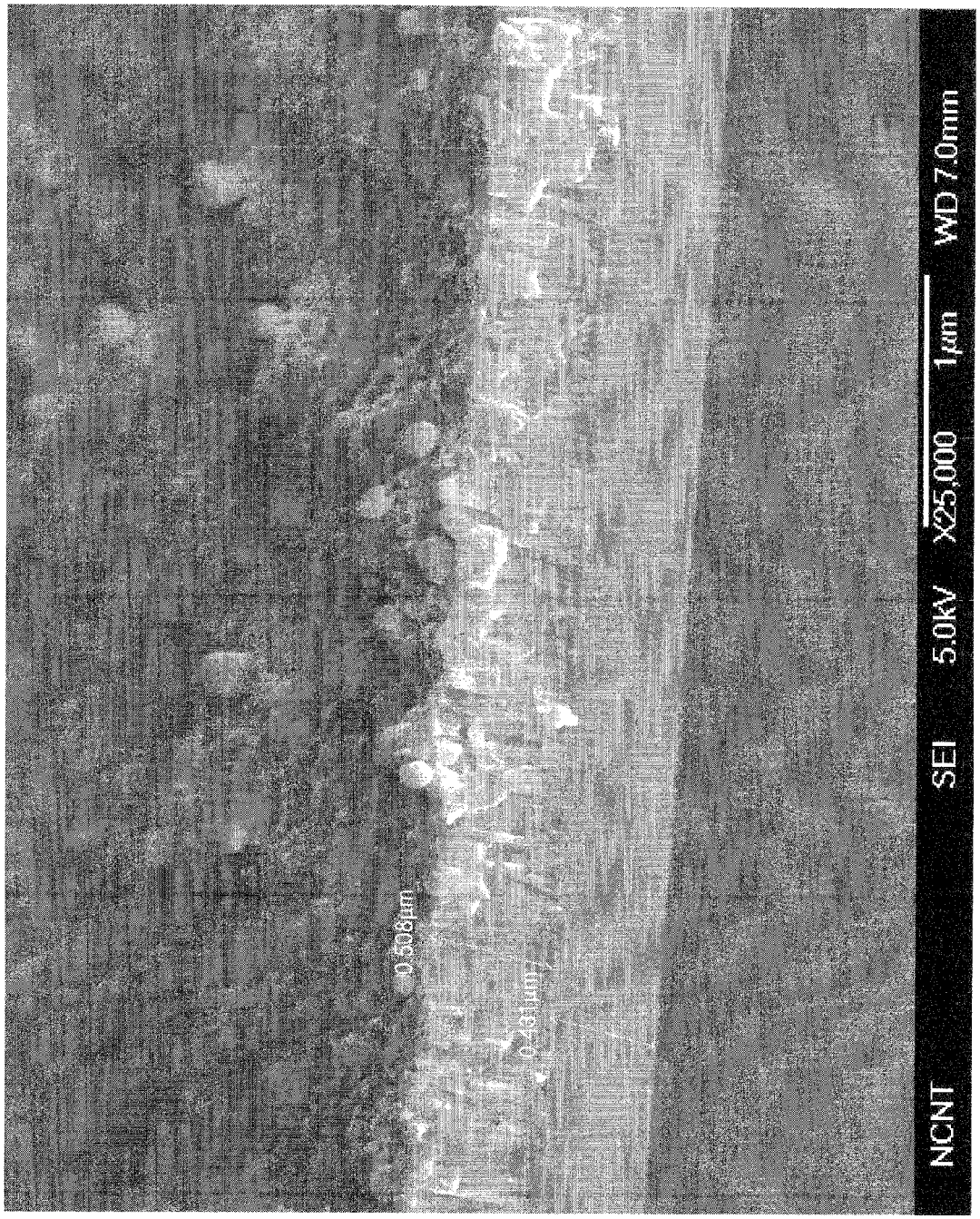
FIG. 7 is a FE-SEM image (30,000 times magnification) of a surface of the barrier layer of the organic light emitting apparatus manufactured in Comparative Example.

An organic light emitting apparatus was manufactured in the same manner as in the above Example except that an aluminum layer was formed on the $Al_2O_3$ layer stacked on the substrate by sputtering. Turning now to FIGS. 6 and 7, FIG. 6 is a FE-SEM image of a cross-section of a barrier layer prior to forming an organic light emitting device and FIG. 7 is a FE-SEM image of a surface of the barrier layer. As shown in FIGS. 6 and 7, the barrier layer was formed to have a non-uniform thickness and a rough surface due to agglomerate particles thereof.

According to an organic light emitting apparatus and a method of manufacturing the same according to one or more embodiments of the present invention, the characteristics of a barrier layer may be maintained and a stress issue of a substrate may be reduced even at a high temperature, thereby increasing the manufacturing stability of the organic light emitting apparatus. In addition, since layers of a multiple structure may be manufactured using a simple deposition technique instead of a general wet process, a substrate may be mass-produced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting apparatus comprising:
    a substrate;
    a barrier layer arranged on the substrate;
    an organic light emitting device comprising a first electrode, an organic light emitting layer, and a second electrode that are sequentially arranged on the barrier layer; and
    an encapsulation layer covering the organic light emitting device,
    wherein at least one of the barrier layer and the encapsulation layer is a composite layer arrangement comprising a first inorganic layer, a first organic layer, and a second inorganic layer that are sequentially stacked, wherein a thickness of the first organic layer is in the range of about 1 nm to about 1 µm, and
    wherein the first organic layer is a polyimide layer produced by a dry process that adjusts said thickness of the first organic layer, the process comprising:
    depositing a monomer via a technique selected from a group consisting of a thermal evaporation technique, a plasma enhanced chemical vapor deposition (PECVD) technique and an atomic layer deposition (ALD) technique; and then
    heating the monomer.

2. The organic light emitting apparatus of claim 1, wherein the monomer for forming the polyimide layer comprises:
    at least one acid component selected from a group consisting of perylenetetracarboxylic dianhydride (PTCDA) and biphenyltetracarboxylic dianhydride (BPDA); and
    at least one amine component selected from the group consisting of diaminododecane (DADD) and phenylene diamine (PDA).

3. The organic light emitting apparatus of claim 1, wherein the first inorganic layer and the second inorganic layer each independently comprises at least one material selected from a group consisting of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride (SiON), and aluminum.

4. The organic light emitting apparatus of claim 1, further comprising at least one stack layer arrangement comprised of a second organic layer and a third inorganic layer, wherein the at least one stack layer arrangement is arranged on the second inorganic layer.

5. The organic light emitting apparatus of claim 1, wherein the composite layer arrangement comprises alumina, polyimide, and alumina that are sequentially arranged.

6. The organic light emitting apparatus of claim 1, wherein a thickness of the composite layer arrangement is in the range of about 10 nm to about 10 µm.

7. The organic light emitting apparatus of claim 1, wherein a thickness of the first organic layer is in the range of about 300 to about 500 nm.

8. The organic light emitting apparatus of claim 1, wherein the barrier layer is interposed in between the substrate and the organic light emitting device.

9. The organic light emitting apparatus of claim 1, wherein each of the first and second inorganic layers and the first organic layer are produced in an in-line deposition apparatus.

10. A method of manufacturing an organic light emitting apparatus, comprising:
    preparing a substrate;
    forming a barrier layer on the substrate;
    forming an organic light emitting device comprising a first electrode, an organic light emitting layer, and a second electrode that are sequentially arranged on the barrier layer; and
    forming an encapsulation layer on the organic light emitting device to cover the organic light emitting device,
    wherein the forming of the barrier layer comprises:
    forming a first inorganic layer;
    forming a first organic layer comprising polyimide by depositing a monomer on the first inorganic layer via a dry process that adjusts a thickness of the first organic layer, the dry process being selected from a group consisting of a thermal evaporation technique, a plasma enhanced chemical vapor deposition (PECVD) technique and an atomic layer deposition (ALD) technique and then heating the monomer, wherein said thickness of the first organic layer is in the range of about 1 nm to about 1 µm; and
    forming a second inorganic layer on the first organic layer.

11. The method of claim 10, wherein the monomer for forming polyimide comprises:
    at least one acid component selected from a group consisting of perylenetetracarboxylic dianhydride (PTCDA) and biphenyltetracarboxylic dianhydride (BPDA); and
    at least one amine component selected from a group consisting of diaminododecane (DADD) and phenylene diamine (PDA).

12. The method of claim 10, wherein the heating of the monomer comprises heating the monomer to a temperature of about 85 to about 350° C.

13. The method of claim 10, wherein the heating of the monomer comprises heating the monomer to a temperature of about 85 to about 125° C.

14. The method of claim 10, wherein a thickness of the first organic layer is in the range of about 300 to about 500 nm.

15. The method of claim 10, wherein an entire thickness of the first inorganic layer, the first organic layer and the second inorganic layer is in the range of about 10 nm to about 10 µm.

16. The method of claim 10, further comprising:
    forming a second organic layer comprising polyimide by depositing a monomer on the second inorganic layer via a technique selected from a group consisting of a thermal evaporation technique, a PECVD technique or an ALD technique and then heating the monomer; and
    forming a third inorganic layer on the second organic layer.

17. The method of claim 10, wherein the forming of the encapsulation layer comprises:
   forming a first inorganic layer;
   forming a first organic layer comprising polyimide by depositing a monomer on the first inorganic layer via a technique selected from a group consisting of a thermal evaporation technique, a PECVD technique and an ALD technique and then heating the monomer; and
   forming a second inorganic layer on the first organic layer.

18. An organic light emitting apparatus fabricated by the method of claim 10, further comprising:
   a second organic layer comprising polyimide formed by depositing a monomer on the second inorganic layer via a technique selected from a group consisting of a thermal evaporation technique, a PECVD technique or an ALD technique and then heating the monomer; and
   a third inorganic layer formed on the second organic layer.

19. An organic light emitting apparatus fabricated by the method of claim 10, wherein the encapsulation layer comprises:
   a first inorganic layer;
   a first organic layer comprising polyimide formed by depositing a monomer on the first inorganic layer via a technique selected from a group consisting of a thermal evaporation technique, a PECVD technique and an ALD technique and then heating the monomer; and
   a second inorganic layer formed on the first organic layer.

20. The method of claim 10, wherein the first and second inorganic layers are formed by a technique selected from a group consisting of sputtering, chemical vapor deposition, electron-beam, heat deposition and thermal ion beam assisted deposition, and wherein each of the first and second inorganic layers and the first organic layer are deposited in-line.

* * * * *